United States Patent
Lindner et al.

(10) Patent No.: US 6,223,654 B1
(45) Date of Patent: May 1, 2001

(54) PRINTING PLATE

(75) Inventors: Bernd Lindner, Heusenstamm; Berthold Seib, Rodgau, both of (DE)

(73) Assignee: MAN Roland Druckmaschinen AG (DE)

( * ) Notice: Subject to any disclaimer, the term of this patent is extended or adjusted under 35 U.S.C. 154(b) by 0 days.

(21) Appl. No.: 09/355,459

(22) PCT Filed: Jan. 14, 1998

(86) PCT No.: PCT/EP98/00178
§ 371 Date: Jul. 29, 1999
§ 102(e) Date: Jul. 29, 1999

(87) PCT Pub. No.: WO98/33651
PCT Pub. Date: Aug. 6, 1998

(30) Foreign Application Priority Data

Jan. 31, 1997 (DE) .......................... 297 01 585 U

(51) Int. Cl.⁷ ................ B41N 1/00; B41F 1/34; B41F 21/12; B41F 21/14; B41L 3/02
(52) U.S. Cl. ............ 101/395; 101/485; 101/486; 101/DIG. 36; 101/DIG. 46
(58) Field of Search ........................ 101/454, 458, 101/459, 460, 395, 401.1, 415.1, 481, 482, 485, DIG. 36, DIG. 46, 486; 270/52.08, 58.02, 58.03; 271/3.13, 226, 232, 154; 428/596, 571, 621, 192, 195, 209; 83/33, 371, 924

(56) References Cited

U.S. PATENT DOCUMENTS

| 2,294,456 | * | 9/1942 | Hawley ................ 101/DIG. 36 |
| 3,044,508 | * | 7/1962 | Sherman ........................ 144/2 |
| 3,723,122 | * | 3/1973 | Yano et al. ..................... 96/48 R |
| 3,955,503 | * | 5/1976 | Von Hofe ........................ 101/426 |
| 4,082,039 | * | 4/1978 | Schutt et al. ............... 101/DIG. 46 |
| 4,665,824 | * | 5/1987 | Greiner et al. ............. 101/DIG. 46 |
| 5,551,337 | * | 9/1996 | Miki et al. ............... 101/DIG. 46 |
| 5,694,853 | * | 12/1997 | Stempien ..................... 101/401.1 |
| 5,802,974 | * | 9/1998 | McNeil ................... 101/DIG. 36 |

FOREIGN PATENT DOCUMENTS

| 42 26 780 C2 | 2/1994 | (DE) . |
| 43 38 664 C2 | 5/1995 | (DE) . |
| 1130496 | * 10/1968 | (GB) ............... 101/DIG. 46 |

* cited by examiner

Primary Examiner—Kimberly Asher
(74) Attorney, Agent, or Firm—Leydig, Voit & Mayer, Ltd.

(57) ABSTRACT

A printing plate for an offset printing machine which comprises an electrically non-conductive material adapted for mounting on a plate cylinder of the printing machine and which has cuts in at least one area thereof adapted to cooperate with register pins arranged on the plate cylinder. An electrically conductive layer is arranged on the printing plate in the area of the cuts for making electrical contact with the register pins to facilitate proper mounting of the plate on the cylinder.

8 Claims, 1 Drawing Sheet

PRINTING PLATE

FIELD OF THE INVENTION

The invention relates to a printing plate and more particularly to an improved printing plate for sheet-fed offset printing machines.

BACKGROUND OF THE INVENTION

The printing forms in sheet-fed offset printing presses consist of flexible printing plates spanned about a plate cylinder. In order that the printing plate comes to lie in register on the plate cylinder of the printing mechanism, on the edge allocated to the print start of the printing plates there are arranged register cuts in the form of perforations or cuts, which cooperate with corresponding fitting pins or other form parts in the area of the clamp rail. As a result the flexible plate, prior to fastening to the edge assigned to the print start, is aligned both in the lateral and also in the circumferential direction.

The most widespread printing plates for sheet-fed offset printing presses consist of a thin aluminum plate. In such aluminum printing plates it is possible with the register cuts briefly described above, besides register pins, to establish the correct onlay of the printing plate with its cuts on the registering means of the cylinder by an electrical interrogation. For this purpose either the register pins altogether, or parts of these register pins, are arranged electrically insulated with respect to the plate cylinder so that through a printing plate lying correctly on the pins in the zone of the register cuts, the insulation is bridged in the manner of a switch. A printing plate with register cuts arranged on the edge assigned to the print start, which cooperates with electrically interrogatable register pins, is known from DE 42 26 780 C2. From DE 43 38 664 C2 it is known, further, that such electrically interrogatable registering arrangements on the plate cylinder of printing presses make it possible to automate a printing plate change operation. Thus, it is possible to execute the fastening of a new printing plate to be fed in automatically, in dependence on the in-register positioning of the printing plate. Further, it is likewise possible, after opening of the print start clamping bar, to determine whether the used printing plate has been moved out of the clamping gap.

Besides printing plates comprising a thin aluminum plate, in sheet-fed offset printing presses there are also used printing plates in the form of thin plastic foils. The advantage of such plastic foils lies in that with certain film-exposure apparatuses it is possible to expose corresponding coated plastic foils and therewith to structure the ink-receiving from the non ink-receiving plates.

In order to make it possible to fit these plastic foils as printing plates, some are provided with cuts in correspondence with the register system installed on the print start bar. Since the plastic material of such printing foils, however, is not electrically conductive, or is not electrically conductive to the intended degree, an electric register control of the type previously described cannot be used. In a printing press with such an electric register control, this must be switched off when such printing foils are used, or the automated and successively following processes of a printing plate change operation must be monitored and manually controlled by an operator.

OBJECTS AND SUMMARY OF THE INVENTION

In view of the foregoing, an object of the present invention is to provide a printing plate construction which enables plates of elelectrically non-conductive material to be used more easily in printing machines having electric register control systems.

The present invention provides these and other advantages and overcomes the drawbacks of the prior art by providing a printing plate of electrically non-conductive material that is adapted so as to be used with electric register control systems.

According to the invention it is provided that the printing plate (plastic foil) consisting of electrically non-conducting material has, at least in the area provided for the register cuts, a layer of electrically conductive material. There it can be provided that this layer of electrically conductive material extends over the entire form width of the printing plate along the plate edge allocated to the print strat (strip of thin aluminum foil). It can be provided that the layer of electrically conductive material (aluminum foil) before the punching (cutting) of the printing plate is glued to the points of the front edge of the printing plate provided for the cuts. Preferably there the electrically conductive layers to be glued to the printing plate are constructed as self-adhesive area pieces and are applied only shortly before the cutting (punching) operation to the cutting points in the area of the front edge of the printing plate.

These and other features and advantages of the invention will be more readily apparent upon reading the following description of preferred exemplary embodiments of the invention and upon reference to the drawings wherein:

While the invention will be described and disclosed in connection with certain preferred embodiments and procedures, it is not intended to limit the invention to those embodiments. Rather it is intended to cover all such alternative embodiments and modifications as fall within the spirit and scope of the invention.

DETAILED DESCRIPTION OF PREFERRED EMBODIMENTS

Figure 1:
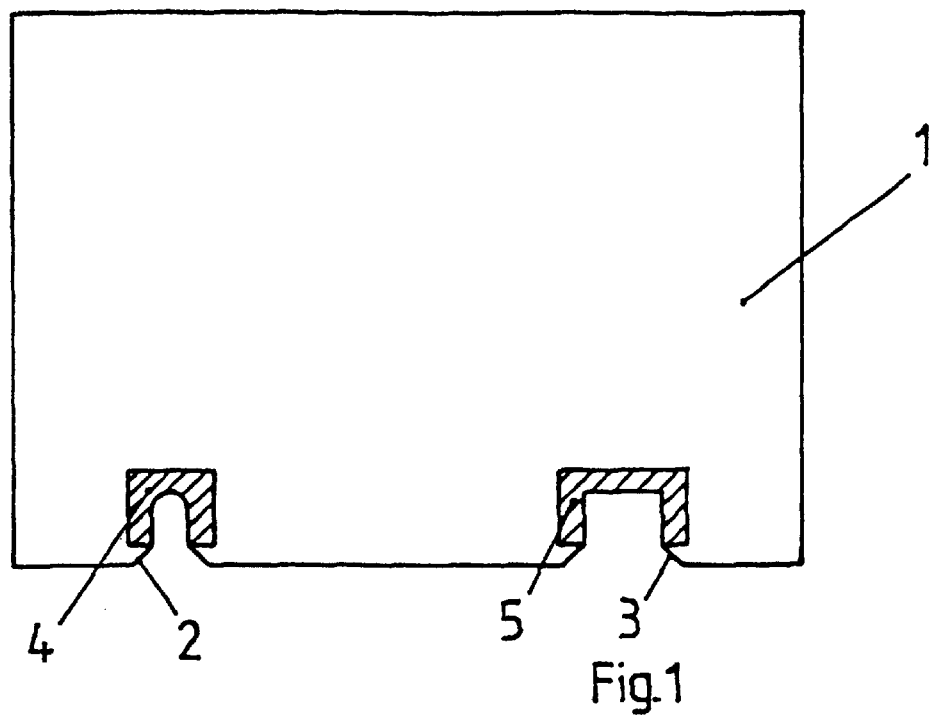
FIG. 1 is a plan view of a printing plate according to the invention with applied cuts and FIG. 2 is a plan view of a printing plate with the glued-on electrically conductive layers before the cutting (operation).
Figure 2:
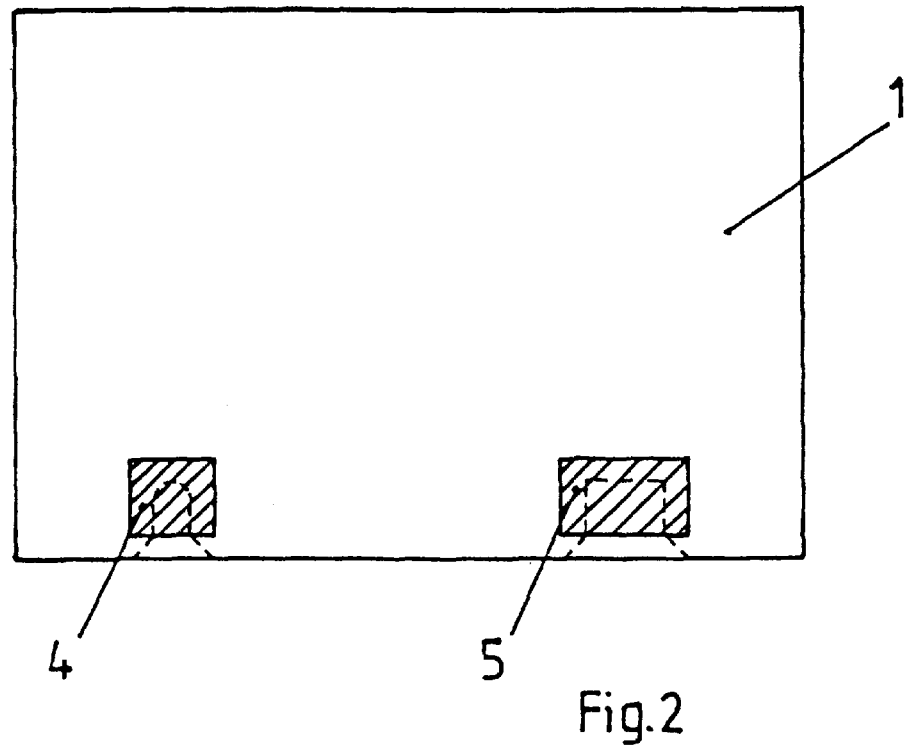

FIGS. 1 and 2 show in each case a printing plate 1 which consists of electrically non-conductive plastic material. As represented in FIG. 1, on the edge assigned to the print beginning of the printing plate 1 there are arranged cuts 2, 3, which cooperate with form parts not shown in the figures and register pins arranged on the plate cylinder of the printing press or correspondingly constructed form parts.

Before the making of the cuts 2, 3 on the front edge of the printing plate 1, to the points of the printing plate intended for the cutting operation, electrically conductive layers 4, 5 are applied to the surface of the printing plate 1 (FIG. 2). With these electrically conductive layers 4, 5 a material preferably of rectangular pieces of thin aluminum foil is used, one side of which is made with a self-adhesive.

In FIG. 2, the areas on the front edge of the printing plate 1 intended for the cuts are arranged in broken lines. Further, it can be provided to apply the electrically conductive layers 4, 5 in the form of electrically self-adhesive aluminum foils either to the side of the printing plate 1 laying outside when printing with the printing plate 1, or to the side facing the plate cylinder. What is essential is merely that after making the cuts 2, 3 on the front side of the printing plate 2 (FIG.

1), the cut edge of the electrically conductive layers 4, 5 can be brought into electrically conducting contact with the corresponding register pins or form-pieces of the plate cylinder.

What is claimed is:

1. A printing plate, especially for sheet-fed offset printing presses, consisting of a plate spannable on a plate cylinder, said printing plate being made of electrically non-conductive material, in which the plate has in at least one area cut, perforation or the like, which is adapted to cooperate with one or more register pins or other form-parts arranged on a plate cylinder, characterized in that the printing plate (1) has an electrically conductive layer (4,5) in the at least one area of the cut, perforation or the like.

2. A printing plate for a sheet-fed offset printing machine having a plate cylinder with one or more register pins arranged thereon, the printing plate comprising:

a plate of electrically non-conductive material which is mountable on the plate cylinder of the printing machine, wherein the plate has one or more cuts in at least one area thereof which are adapted to cooperate with register pins arranged on a plate cylinder, and an electrically conductive layer arranged on the plate in said at least one area wherein said cuts are located.

3. The printing plate according to claim 2 wherein the printing plate has a plurality of cuts arranged in spaced relation from one another and an electrically conductive layer is arranged in the area of each of the cuts.

4. The printing plate according to claim 2 wherein the electrically conductive layer comprises a thin metal layer.

5. The printing plate according to claim 4 wherein the metal layer includes aluminum.

6. The printing plate according to claim 2 wherein the electrically conductive layer is applicable to one side of the printing plate by means of a self-adhesive layer.

7. The printing plate according to claim 2 wherein the electrically conductive layer is arranged on an outer side of the plate which faces away from a plate cylinder when the plate is mounted on a plate cylinder.

8. The printing plate according to claim 2 wherein the electrically conductive layer is arranged on an inner side of the plate which faces a plate cylinder when the plate is mounted on a plate cylinder.

* * * * *